(12) United States Patent
Nikoobakht

(10) Patent No.: US 9,372,283 B2
(45) Date of Patent: Jun. 21, 2016

(54) NANOENGINEERED DEVICES BASED ON ELECTRO-OPTICAL MODULATION OF THE ELECTRICAL AND OPTICAL PROPERTIES OF PLASMONIC NANOPARTICLES

(75) Inventor: Babak Nikoobakht, Potomac, MD (US)

(73) Assignee: Babak Nikoobakht, Potomac, MD (US)

( * ) Notice: Subject to any disclaimer, the term of this patent is extended or adjusted under 35 U.S.C. 154(b) by 589 days.

(21) Appl. No.: 12/943,325

(22) Filed: Nov. 10, 2010

(65) Prior Publication Data

US 2011/0116168 A1    May 19, 2011

Related U.S. Application Data

(60) Provisional application No. 61/260,850, filed on Nov. 13, 2009.

(51) Int. Cl.
| | |
|---|---|
| G02B 1/10 | (2015.01) |
| B82Y 20/00 | (2011.01) |
| E06B 3/67 | (2006.01) |
| G02B 5/22 | (2006.01) |
| G02B 26/02 | (2006.01) |
| G02F 1/17 | (2006.01) |
| H01L 31/101 | (2006.01) |
| G02F 1/153 | (2006.01) |

(52) U.S. Cl.
CPC . *G02B 1/10* (2013.01); *B82Y 20/00* (2013.01); *E06B 3/6722* (2013.01); *G02B 5/22* (2013.01); *G02B 26/026* (2013.01); *G02F 1/17* (2013.01); *H01L 31/101* (2013.01); *G02B 2207/101* (2013.01); *G02F 2001/1536* (2013.01); *G02F 2202/36* (2013.01); *G02F 2203/10* (2013.01)

(58) Field of Classification Search
CPC ............... G02B 6/004; G02B 6/0229; G02B 2207/101; G02B 1/10; G02B 5/22; G02B 26/26; G02F 2202/36; G02F 2001/1536; H01L 21/02601; H01L 51/0046; H01L 21/02606; H01L 51/0048; H01L 2251/5369; G01N 27/127; G01N 27/3278; G01N 33/54346; H01S 3/169; H01S 5/1067; B82Y 20/00; H10L 21/101
USPC .................................... 359/585, 599; 977/834
See application file for complete search history.

(56) References Cited

U.S. PATENT DOCUMENTS

| | | | |
|---|---|---|---|
| 6,884,478 | B2 | 4/2005 | Alivisatos et al. |
| 7,119,161 | B2 | 10/2006 | Lawandy |
| 2002/0145792 | A1* | 10/2002 | Jacobson .................. B41J 2/01 359/296 |
| 2004/0150865 | A1* | 8/2004 | Chen ..................... B82Y 20/00 359/252 |
| 2005/0250243 | A1* | 11/2005 | Bonnell et al. ................. 438/57 |
| 2007/0158642 | A1* | 7/2007 | Gruner .................. B82Y 10/00 257/40 |
| 2008/0037022 | A1* | 2/2008 | Nishikawa et al. ........... 359/839 |
| 2008/0191606 | A1* | 8/2008 | Geohegan ............. B82Y 30/00 313/501 |
| 2008/0206972 | A1* | 8/2008 | Kahen ........................... 438/542 |

(Continued)

*Primary Examiner* — Bumsuk Won
*Assistant Examiner* — Jeffrey Madonna

(57) ABSTRACT

This invention provides application of noble metal nanoparticles for devices with controlled light transmission, absorption and detection. Particularly described is the use of noble metal nanoparticles in photoconductive detectors, optical filters, optical switches, pixel arrays, and electrochromic windows for controlling the transmission and absorption of incident and transmitted light. In addition, the use of noble metal nanoparticles in an electrochromic display is described in which color of the transmitted light from a nanoparticle-based pixel is adjusted and controlled.

9 Claims, 8 Drawing Sheets

(56) References Cited

U.S. PATENT DOCUMENTS

| | | | |
|---|---|---|---|
| 2009/0034055 A1* | 2/2009 | Gibson | 359/296 |
| 2009/0059368 A1* | 3/2009 | Kamada | 359/494 |
| 2009/0189144 A1* | 7/2009 | Quitoriano | H01L 31/101 257/12 |
| 2009/0255579 A1* | 10/2009 | Zaimidoroga | B82Y 20/00 136/254 |
| 2010/0019334 A1* | 1/2010 | Ivanov et al. | 257/432 |
| 2010/0202272 A1* | 8/2010 | Kim | B82Y 10/00 369/112.2 |
| 2010/0243020 A1* | 9/2010 | Norton | B82Y 20/00 136/244 |
| 2013/0112254 A1* | 5/2013 | Lorenzetti | H01L 31/03529 136/255 |
| 2013/0164530 A1* | 6/2013 | Bard | B82Y 15/00 428/401 |

* cited by examiner

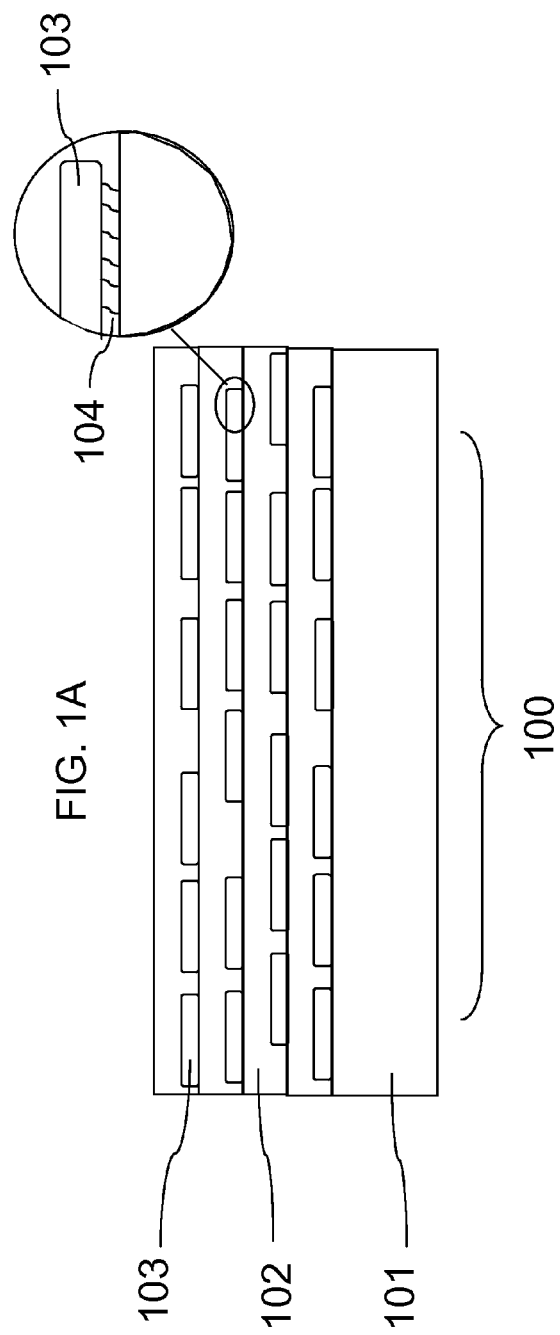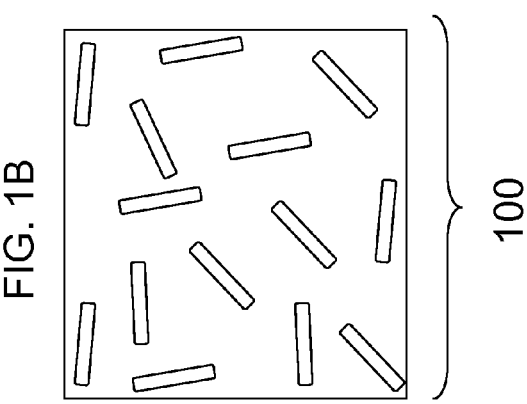

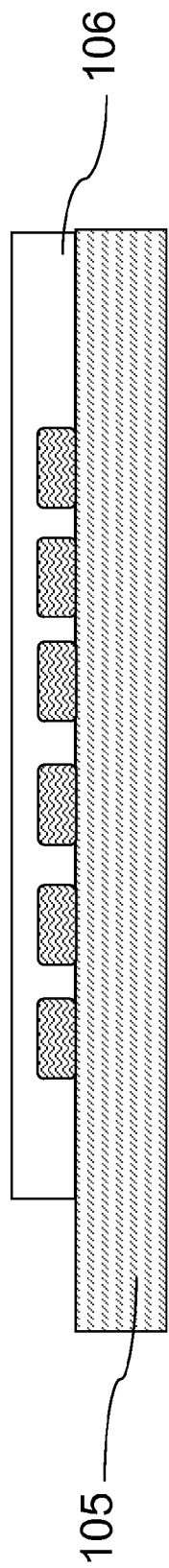
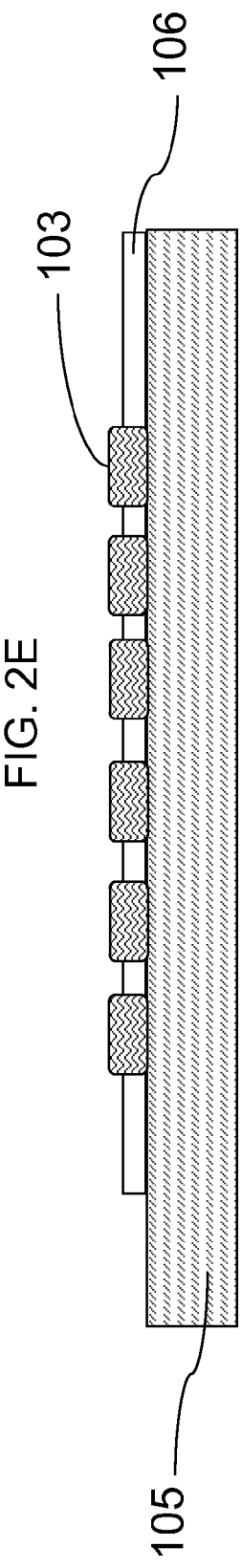

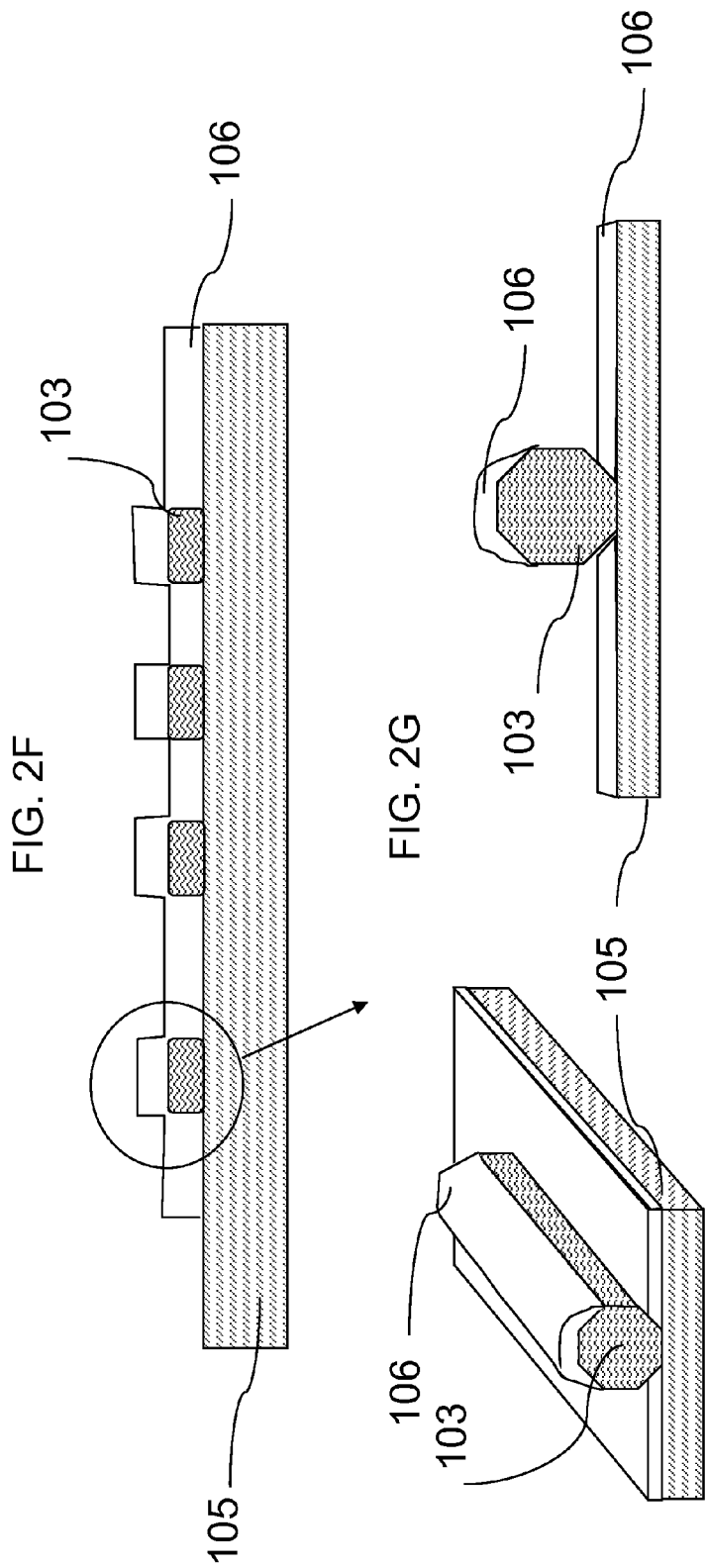

NANOENGINEERED DEVICES BASED ON ELECTRO-OPTICAL MODULATION OF THE ELECTRICAL AND OPTICAL PROPERTIES OF PLASMONIC NANOPARTICLES

CROSS-REFERENCE TO RELATED APPLICATIONS

This application claims the benefit of U.S. Provisional Patent Application Ser. No. 61/260,850, filed on Nov. 13, 2009, the disclosure of which is incorporated herein in its entirety by reference.

FIELD OF THE INVENTION

This invention relates in general to application of noble metal and semiconductor nanocrystals for devices with controlled light transmission, absorption and detection. Particularly described in here is the use of noble metal nanocrystals in photoconductive detectors, electrochromic windows for controlling the transmission and absorption of incident and transmitted light. In addition the use of noble metal nanocrystals in an electrochromic display is described in which color of the transmitted light from a nanoparticle-based pixel is adjusted and controlled.

BACKGROUND

Noble metal nanoparticles such as gold nanospheres and nanorods have been of great research interest and have become very promising nanomaterials in applications such as photothermal cancer therapeutics, biological imaging in the near-infrared region, surface-enhanced Raman scattering sites, etc. There is tremendous interest in other applications using nanomaterials.

SUMMARY

According to one aspect of the present invention, a nanoengineered device is provided that includes a base substrate, and at least one layer deposited over the base substrate, wherein the at least one layer includes at least one noble metal nanoparticle, further wherein the at least one noble metal nanoparticle operably adjusts light absorption and transmission.

According to another aspect of the present invention, the at least one noble metal nanoparticle is selected from the group consisting of a nanorod, nanosphere, nanoprism, nanocube, nanoshell, nanotube, and nanostar.

According to yet another aspect of the present invention, the noble metal nanoparticle is a gold nanorod.

According to yet another aspect of the present invention, a nanoengineered device is provided wherein at least one layer deposited over the base substrate has a thickness of between about 10 nm and about 500 nm.

According to another aspect of the present invention, a nanoengineered device is provided that includes a base substrate, at least one layer deposited over the base substrate, wherein the at least one layer includes at least one noble metal nanoparticle, further wherein the at least one noble metal nanoparticle operably adjusts light absorption and transmission, and wherein the nanoengineered device further includes at least one dielectric layer.

According to another aspect of the present invention, a nanoengineered device is provided that includes at least one layer deposited over a base substrate, wherein the layer includes at least one noble metal nanoparticle, and wherein at least one noble metal nanoparticle has an aspect ratio greater than about one. According to another aspect, the at least one layer of the nanoengineered device is selected from the group consisting of a dielectric layer, conductive layer, and semiconductive layer.

According to a further aspect of the present invention, the conductive or semiconductive layer is treated with one or more linking molecules selected from the group consisting of dithiols, diamines, amino-silane molecules. In a preferred aspect, the linking molecule includes 3-aminopropyltriethoxy-silane.

According to yet another aspect of the present invention, a nanoengineered device is provided that further includes at least two conductive layers, wherein a plurality of noble metal nanoparticles are positioned between the two conductive layers.

According to yet another aspect of the present invention, a nanoengineered device is provided that is selected from the group consisting of an electrochromic display, an optical switch, a photoconductive detector, and a device that includes at least one nanoparticle-based pixel.

According to yet another aspect of the present invention, a method of forming a nanoengineered device is provided, wherein the method comprises forming a base substrate; depositing a first conductive layer over the base substrate; depositing a plurality of noble metal nanoparticles over the first conductive layer; depositing a dielectric layer over the first conductive layer and over a top portion of each noble metal nanoparticle; and depositing a second conductive layer, wherein the plurality of noble metal nanoparticles operably adjust light absorption and transmission.

According to still another aspect of the present invention, a multilayer nanoengineered device is provided that includes a base substrate; a first conductive layer deposited over the base substrate; a plurality of noble metal nanoparticles deposited over the first conductive layer; and a second conductive layer deposited over the plurality of noble metal nanoparticles, wherein the plurality of noble metal nanoparticles operably adjust light absorption and transmission. According to yet another aspect of the present invention, a multilayer nanoengineered device is provided that further includes a dielectric layer deposited over at least one of the first conductive layer, the second conductive layer, and a top portion of each noble metal nanoparticle. According to yet another aspect of the present invention, a multilayer nanoengineered device is provided wherein the plurality of noble metal nanoparticles includes at least one gold nanorod. According to a further aspect of the present invention, a multilayer nanoengineered device is provided wherein each of the first conductive layer and the second conductive layer has a thickness of between about 10 nm and about 500 nm.

According to yet another aspect of the present invention, a multilayer nanoengineered device is provided, wherein at least one of the noble metal nanoparticles has an aspect ratio greater than about one.

According to yet another aspect of the present invention, a multilayer nanoengineered device is provided, wherein the first conductive layer and the second conductive layer are treated with one or more linking molecules selected from the group consisting of dithiols, diamines, amino-silane molecules, and preferably wherein the linking molecules comprise 3-aminopropyltriethoxy-silane.

According to yet another aspect of the present invention, a multilayer nanoengineered device is provided, wherein the device is selected from the group consisting of an electrochromic display, an optical switch, a photoconductive detector, and a device that includes at least one nanoparticle-based pixel.

Additional aspects and advantages of the invention will become more clear from the following detailed description of embodiments, taken in conjunction with the drawings, wherein like reference numerals refer to like features.

BRIEF DESCRIPTION OF THE DRAWINGS

These and/or other aspects and advantages of the invention will become apparent and more readily appreciated from the following description of the embodiments, taken in conjunction with the accompanying drawings.

FIG. 1(A) illustrates one embodiment of an optical filter, according to one embodiment of the present invention that is composed of stacks of gold nanorods deposited on transparent thin dielectric layers.

FIG. 1(B) depicts a top view of the device shown in FIG. 1(A), wherein nanorods are deposited in either an oriented fashion or in a random fashion.

FIG. 2(D) depicts deposited nanorods on the bottom conductive layer which are coated with a dielectric layer.

FIG. 2(E) depicts chemical etching which is carried out to expose the overcoated nanorods and ready for deposition of the top conductive layer. FIG. 2(F) depicts, in another embodiment, the dielectric layer that is direct deposited so that the sides of nanorods are not coated. FIG. 2(G) depicts, according to another embodiment, the exposed sides of nanorods from two different perspectives, a three-dimensional view and front perspective. FIG. 2(H) depicts one embodiment of a completed nanorod-nanojunction after deposition of the top conductive layer.

FIG. 4 depicts another embodiment of an optical switch which contains more than a single layer of nanorod as conductive junctions.

DETAILED DESCRIPTION

Figure 2A:
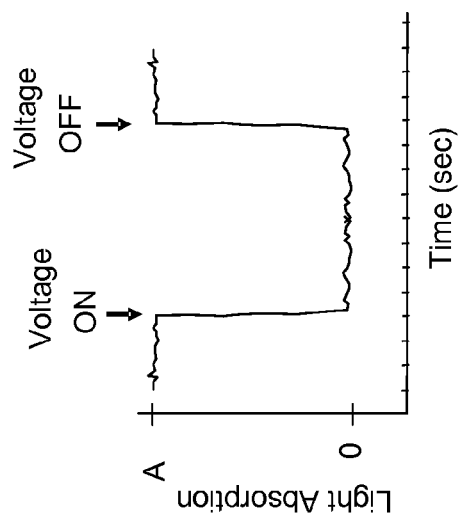
FIG. 2(A) depicts a top view of an electro-chromic optical switch in which nanorods are sandwiched between two conductive or semiconductive layers.

Reference will now be made in detail to the representative embodiments of the present invention, examples of which are illustrated in the accompanying drawings, wherein like reference numerals refer to like elements throughout. The embodiments which are described below are provided as representative embodiments, but should not be construed as limiting the scope of the present invention.

This invention generally relates to a platform in which coherent oscillation of electrons is intentionally dephased to switch off or on the optical absorption/scattering of noble metal nanoparticles in UV, visible and infrared (IR) regions of the electromagnetic spectrum. This modulation has application in solid state electronics, electro-optical devices, optical filters, photon sensing and display devices. In another aspect of this invention, modulation of charge transport through nanoparticle-nanojunctions by optical excitation of surface plasmon of nanoparticles is used as a photodetection platform. This invention also discloses methods for fabricating a metal nanoparticle-based electrochromic window, a metal nanoparticle-based electrochromic display, and a photon detector. Nanoparticles include noble metal and semiconductor nanocrystals of different shapes that have surface plasmon resonance frequencies in the UV to IR regions.

As used herein, "noble metal nanoparticle" is intended to include any suitable or desired nanoparticle that includes a noble metal. Some examples of noble metals that may be used in accordance with the present invention include, but are not limited to, gold, silver, copper, and platinum. In accordance with the present invention, noble metal nanoparticles can be formed in any suitable or desired shape and size, for example, as a nanorod, nanosphere, nanoprism, nanocube, nanoshell, nanotube, and nanostar. It is to be understood that these are only representative examples of noble metal nanoparticles, but in no way are limiting examples and in no way limit the scope of the invention.

As used herein, a "nanoengineered device" is intended to include any device, for instance, a conductive or semi-conductive device, that includes at least one noble metal nanoparticle. Such devices include, for instance, an electrochromic display, an optical switch, a photoconductive detector, and a device that includes at least one nanoparticle-based pixel. It is to be understood that these are only representative examples of nanoengineered devices, but in no way are limiting examples and in no way limit the scope of the invention.

As used herein, "linking molecules" are intended to include any molecule that operates to link a nanoparticle to a substrate, medium, or other layer such as a conductive or semi-conductive layer; hence, a linking molecule effectively operates to link the binding of the nanoparticle, e.g., a gold nanorod, to a substrate or other such layer. Any suitable linking molecule (104) can be used in accordance with the present invention, and in any suitable concentration and thickness. Examples of preferred linking molecules (104) include, for instance, dithiols, diamines, amino-silane molecules such as 3-aminopropyltriethoxy-silane and other molecules with two end groups capable of linking nanorods to a surface. The linking molecule (104) 3-aminopropyltriethoxy-silane, for instance, binds from one end to the Si—O groups on a surface, while its nitrogen side is dangling freely. The nitrogen atom has the potential of binding to the surface of a gold nanorod.

As used herein, "aspect ratio" is intended to refer to the ratio of length to width. For instance, a nanorod interacts with light in a wide range of wavelengths depending on its size and aspect ratio (ratio of length to width), thus it can be used to absorb or scatter light in these regions as well. Exemplary aspect ratios of noble metal nanoparticles, e.g., gold nanorods, can be any value greater than about one.

As used herein, "surface plasmon absorption" refers to a coherent oscillation of electrons with a certain resonance frequency that takes place in a noble metal nanocrystal upon optical excitation of the nanocrystal. The term "surface plasmon resonance frequency" refers to the frequency of coherent oscillation of electrons inside a noble metal nanocrystal.

When a noble metal nanoparticle is excited with a proper electromagnetic wavelength, due to the interaction of the incident light with metal electrons, a coherent oscillation of electrons with a certain resonance frequency takes place. Part of the electron oscillation in a metal nanocrystal, for instance, a gold nanorod leads to scattering of light and the rest is absorbed by the gold crystal. A nanorod interacts with light in a wide range of wavelengths depending on its size and aspect ratio (ratio of length to width), thus it can be used to absorb or scatter light in these regions as well. The light absorption of nanorods, nanospheres, nanoprisms, nanocubes or nanoshells is adjustable in the visible (300 to 700 nm) or infrared region (700 to 20000 nm) by tuning, e.g., their aspect ratio, diameter, shell size and thickness. This tunability makes all these shapes applicable for the disclosed invention.

According to a preferred embodiment, different forms of application of metal and semiconductor nanocrystals in electro-optical and photon-based devices such as optical filters, optical polarizers, photodetectors, smart residential and commercial windows, electrochromic windows, electrochromic displays, etc., are provided. The present invention may, however, be embodied in many different forms and should not be interpreted as limited to the examples set forth herein.

As used in this application, the term "nanorod" is intended to include solid cylindrical objects that have a width smaller than about 100 nm and a length less than about 10000 nm. In this application, the following terms are meant to be synonymous with "nanorod": rod shaped gold nanocrystals, cylindrical shaped gold nanocrystal, spheroidal shaped gold nanocrystal, gold nanorods, and one-dimensional gold nanocrystals. The term "nanocrystal" is intended to include tiny crystals with at least one dimension less than about 100 nm in size. The term "nanoparticle" is intended to include nanocrystals with different shapes that have at least one dimension less than about 100 nm.

Furthermore, although it is preferred to use gold nanorods as an exemplary nanocrystal, it is to be understood that nanomaterials of other noble metals such as silver, copper, platinum, and the like can also be used in the devices disclosed herein. A nanocrystal surface could be protected by different organic molecules or inorganic layers. Also, whenever the disclosure refers to gold nanorods, it is to be understood that other nanocrystals shapes such as nanospheres, nanocubes, nanotubes, nanostars, nanoshells and nanoprisms (triangular prism) may take the place of nanorods. A person skilled in the art would appreciate that the fabrication methods and devices disclosed herein can be used to incorporate other nanomaterials without undue experimentation and as such the scope of the disclosure is intended to include all those applications.

Gold nanorods due to their aspect ratio can absorb and scatter light in a broad region of the electromagnetic spectrum including visible and infrared. In addition to gold, other metals such as silver, copper, platinum or their combinations such as gold-silver, etc, can demonstrate such optical characteristics. In a preferred embodiment of the present invention, gold nanorods regardless of their method of preparation are used as preferred noble-metal nanoparticles. It is preferred that gold nanorods with aspect ratios greater than about one are used due to their adjustable optical absorption and scattering in the aforementioned regions. In one example, such nanoparticles are prepared by a seed-assisted method and/or an electrochemical method using porous membranes as a template for growth of one-dimensional metal nanorods. In the electrochemical method, examples of nanopore size used in a membrane can range from about 10 to about 30 nm and with a length from about 0.3 microns to about 10 microns. Examples of membrane materials include, but are not limited to, polycarbonate or aluminum oxide. In the description herein, exemplary methods of fabrication and details of exemplary electro-optical and photo-based devices are disclosed.

In one preferred embodiment, metal nanorods are applied on a relatively flat surface such as glass to selectively block a region of electromagnetic radiation. One aspect of the present invention pertains to the use of noble metal nanoparticles for filtering near-IR radiation from residential windows. The influx of heat as near-IR radiation goes through glass windows and results in a temperature rise in closed spaces such as residential and commercial areas resulting in an annual energy waste worth billions of dollars. While attempts have been made to use conventional thin film technologies to block parts of near-IR radiation, with all of these conventional approaches, there are numerous disadvantages; in particular, a portion of the visible light is blocked as well. Moreover, with these conventional technologies, thin metal and dielectric layers are used that make them very expensive. According to the present invention, methods and devices employing noble metal nanoparticles are described that overcome the limitations of the previously reported methods.

An ideal optical filter preferably has a sharp cut-off wavelength or a steep absorption tail in the visible region to avoid obstructing the visible light. In addition, its optical density needs to be adjustable. According to preferred methods of the present invention, a high concentration of nanorods is simply deposited on a surface, and preferably with and with a random orientation. This type of deposition results in nanorods that are in close proximity. When nanorods are in close proximity to each other, due to their electric field interactions, the oscillator strength of their dipolar surface plasmon modes declines and higher plasmon mode appear that results in weakening and broadening of the surface plasmon absorption of the collection of deposited nanorods.

According to a preferred embodiment, nanoengineered devices are formed that can include different classes of nanocrystals. These different classes of nanocrystals have surface plasmon resonance absorption in the UV, visible and IR wavelengths. These nanomaterials, due to their enormous electron polarizability, demonstrate outstanding light absorption and scattering which exceed those of other organic or inorganic materials. The optical activities of such nanocrystals are not due to electronic transitions in conventional materials. Instead, the optical activities are due to the coherent oscillation of the electrons in a metal nanoparticle as it is excited by the electric field of a suitable light wavelength. The surface plasmon absorption frequency of a nanoparticle, such as a noble metal nanoparticle, depends on the shape and size of the nanoparticle; thus, by changing the shape or dimensions of the nanoparticle, the resonance frequency can be tuned to different wavelengths in the visible and IR regions.

According to another embodiment, metal and semiconductor nanoparticles are integrated into mediums, and can be used to form nanoengineered devices, such that their electron density can be varied. A "medium" as used herein can include any type of surface; for instance, the medium can include a layer or other material that is electrically conductive, semi-conductive or insulator. Metal nanoparticles, including one or more of the same or different types of noble metal nanoparticles, can be embedded in or deposited on such surfaces or mediums. Utilizing the electron density variation on such surfaces or mediums, the coherent oscillation of electrons in metal nanoparticles in these mediums is perturbed.

As described herein, optical activities are due to the coherent oscillation of the electrons in a metal nanoparticle as it is excited by the electric field of a suitable light wavelength. When this coherent oscillation of electrons is perturbed, the perturbation leads to, for instance, faster dephasing of the surface plasmon oscillation or shift in the surface plasmon resonance frequency. These modulations of optical properties of nanoparticles have been unexpectedly found to control the transmission or absorption of electromagnetic radiation when it interacts with the nanoparticles in the medium.

According to yet another preferred embodiment, new applications of metallic nanoparticles including, for instance, noble metal nanoparticles, are provided. For instance, the present invention provides surprising and unexpected benefits based on applications of metallic nanoparticles in electrochromic surfaces including glass windows, and two-dimensional and three-dimensional flexible and rigid surfaces. According to yet another preferred embodiment, the present invention provides a display pixel made of multilayer thin films that include a plurality of metal nanoparticles.

If nanorods are excited at their plasmon resonance frequency, there is a fluctuation in the extent of transported charge through nanorods.

According to the present invention, such unwanted interactions are eliminated. In one preferred aspect of the invention, instead of depositing a large number of closely spaced nanorods to a given surface, a multilayer structure (100), shown in FIG. 1A, is formed in which each layer (102) contains a plurality of nanorods (103), and with a certain number of nanorods (103) per unit area. Referring to FIG. 1A, all of the layers (102) are deposited on a base substrate (101). The base substrate (101) can be formed of any suitable material and thickness; for instance, the base substrate (101) can be a rigid surface, conductive or non-conductive, such as glass or any flexible surface such as a polymer, biopolymer or fabric. In one embodiment, the surface of the base substrate (101) is coated with a transparent conductive or semiconductive organic or inorganic material.

In a preferred aspect of the invention, the thickness of layer (102) varies between about 10 nm to about 500 nm; and layer (102) is preferably treated in order to facilitate the application of nanoparticles, e.g., nanorods (103), on the surface of layer (102). In other embodiments, the thickness of layer (102) may be at least about 1 nm, preferably at least about 5 nm, and more preferably at least about 10 nm. It is preferred that the surface of layer (102) is treated, wherein treatment includes application of one or more linking molecules (104). As further described herein, linking molecules (104) are intended to include any molecule that operates to link a nanoparticle to a substrate, medium, or other layer (102) such as a conductive or semi-conductive layer; hence, a linking molecule (104) effectively links the binding of the nanoparticle, e.g., a gold nanorod (103), to a layer such as layer (102). Any suitable linking molecule (104) can be used in accordance with the present invention, and in any suitable concentration and thickness. Preferred linking molecules (104) include, for instance, dithiols, diamines, amino-silane molecules such as 3-aminopropyltriethoxy-silane and other molecules with two end groups capable of linking nanorods (103) to a surface. The linking molecule (104) 3-aminopropyltriethoxy-silane, for instance, binds from one end to the Si—O groups on a surface, while its nitrogen side is dangling freely. The nitrogen atom has the potential of binding to the surface of a gold nanorod. The treated surface (102) is dried with nitrogen gas and is exposed to a solution of nanoparticles, for instance, a solution of gold nanorods. The gold nanorod solution can be applied to layer (102) in any suitable concentration, for instance, with a concentration range of about 1 nanomolar to about 10 nanomolar. The carbon chain between the two functional groups can contain different number of carbon atoms preferably ranging from 3 to 10.

In another embodiment, on each layer (102), the concentration of the deposited nanorods (103) is kept less than a "threshold concentration". The threshold concentration is the number of nanorods per unit area beyond which nanorods start to sense each other. Under these conditions, their dipolar surface plasmon band absorption of nanorods starts to interact leading to deterioration of their dipolar surface plasmon bands. The threshold concentration depends on the aspect ratio of nanorods and must be experimentally optimized; however, it is preferred that the nearest neighbor distance to a deposited nanorod is at about 2.5 times the nanorod length.

FIG. 1 is a schematic view of an exemplary nanoengineered device. In this exemplary disclosed architecture, after deposition of the first layer of nanorods (103), as shown in FIG. 1A, a thin layer of silicon oxide spacer (preferably about 20 nm to about 100 nm of thickness) is deposited on the nanorods (103). This layer (102) can be any other inorganic or organic material such as silicon nitride, Poly(methyl methacrylate) (PMMA), and other transparent polymers. The spacer layer can be made by thin film deposition techniques such as spin coating, thermal evaporation, electrochemistry, PECVD, etc. After treatment of the layer (102), nanorods (103) are deposited with a concentration below the "threshold concentration". This sequence is repeated until a desired optical density or optical absorption of nanorods is achieved. FIG. 1B demonstrates the top view of the multi-layer structure. Nanorods or nanocrystals are deposited in a random orientation. The spacer layer is preferably used to guarantee blockage of the interaction between surface plasmon absorption of nanorods (103) in the stacked layers. The thickness of the spacer layer is adjusted such that a minimum interaction between the neighboring layers of nanorods (103) is maintained. To find an optimal distance, it is preferred to coat the spacer layer with a second layer of nanorods (103) and monitor the UV-Vis absorption spectrum of the double layer structure. In this double layer structure, nanorods (103) can be deposited randomly or oriented. If the surface plasmon absorption of the double layer structure has the same resonance frequency as that of dispersed nanorods in solution, this indicates that the thickness of the spacer is suitable and surface plasmon bands of nanorods do not interact. By sequential nanorod and spacer depositions multi-layer structures can be made. Exemplary advantages of this multi-layer structure include, but are not limited to:

i. Total optical density (extinction) of the multi-layer film is the sum of the optical density (extinction) of each individual layer of nanorods.

ii. Original dipolar surface plasmon absorption remains intact.

iii. Optical density (extinction) of the multi-layer film is adjustable to any value.

This technique allows fabrication of multi-layer structures of noble metal nanoparticles, for instance gold nanorods, and spacer layers with very high optical densities that cannot be made by depositing a single layer of nanorods to a surface.

In another aspect of this invention, neutral density filters active in visible to near-IR are made by depositing multiple layers of nanorods, each layer containing nanorods with aspect ratios ranging from about 1 to about 4.5, corresponding to surface plasmon absorption wavelengths of 520 nm to 900 nm. In another aspect of the invention, nanorods with surface plasmon absorption wavelengths up to 2000 nm are used for near-IR filters for efficient blockage of the near-IR radiation from the sun in residential windows. The surface of interest can be part of any closed system in which the flux of near-IR radiation from the outside is not desired. In yet another aspect of the invention, nanorods with surface plasmon absorption wavelengths up to 20000 nm are used for infrared optical filters. In still another aspect of this invention, light polarizers are made by depositing aligned nanorods in a multi-layer structure. In such polarizers, aligned nanorods are deposited at each layer (102) instead of randomly deposited nanorods. By sequential repeating the deposition of layers (102), (103) and (104), different optical components such as polarizers, and neutral density filters that are optically active from visible to IR wavelengths are reliably manufactured according to the methods of the present invention as described herein.

One preferred strategy for depositing aligned metal nanorods or nanoparticles is described as follows. In the first step, a substrate (101) is coated with a layer (102) that is treated with linking molecules (104). The treated surface of layer (102) is then exposed to a solution of a noble metal nanoparticle, for instance, a flow of a gold nanorod solution. The conditions for applying the solution of a noble metal nanoparticle can be varied as needed or desired to achieve a desired result, and the results can be achieved without any undue experimentation.

The deposition of nanorods (103) takes place because of the opposite charges of the nanorods (103) and the surface or by their covalent binding to the linking molecules (104). In another embodiment, a monolayer of a linking molecule (104) is attached by substrate submersion into a solution of an amino-silane molecule such as 3-aminopropyltriethoxy-silane. This molecule from its silicon side reacts with the silicon atoms of the surface, while its nitrogen side is dangling freely. The nitrogen atom has the potential of binding to the surface of a gold nanorod (103). The treated surface (102) is dried with nitrogen gas and is exposed to a flow of a gold nanorod solution with a concentration range of about 1 nanomolar to about 10 nanomolar. The flow rate is changed between about 1 cm/s to about 20 cm/s. As described herein, the conditions for applying the solution of a noble metal nanoparticle can be varied as needed or desired to achieve a desired result, and the results can be achieved without any undue experimentation. In the deposition process, as floating nanorods in solution anchor to nitrogen atoms of amino-silane molecules on the surface of layer (102), they also align in the direction of the flow and completely anchor to the surface of layer (102). Depending on the time period that the surface of layer (102) is exposed to the nanorod solution, the concentration of nanorods (103) attached to the surface is changed.

In another embodiment, when the layer (102) is an organic layer, a surface sensitization is performed to cover the surface of layer (102) with a monolayer of long chain molecules with amine or thiol functions at their free end. This surface is nitrogen dried and is exposed to a flow of nanorod solution for depositing aligned nanorods (103).

According to yet another embodiment, the present invention provides for alignment of nanorods (103) that is suitable for substrates with very large surface areas. Under these circumstances, a wide brush, i.e., a device with bristles, wire or other filaments is preferably used to introduce the nanorods (103) to the surface of layer (102) and also produce the alignment of the nanorods (103) due to the formed capillary forces. The thickness of the wires or filaments can be adjusted as needed or desired, and in one example the thickness preferably ranges from about 1 micron to about 100 microns. The length of the wires or filaments can also be adjusted as needed or desired, and in one example the length preferably ranges from about 2 cm to about 20 cm. A nanorod solution is applied to the brush and nanorods (103) due to the capillary forces are pulled down to the substrate. As the brush is moved over the substrate, e.g., over layer (102), the generated shear force, because of the capillary forces formed around the filaments of the brush, aligns the nanorods (103) along the brushed direction and anchors the nanorods to the surface of layer (102). Simultaneously surface drying is performed in order to avoid rearrangement of the nanorods after their alignment.

Figure 2C:
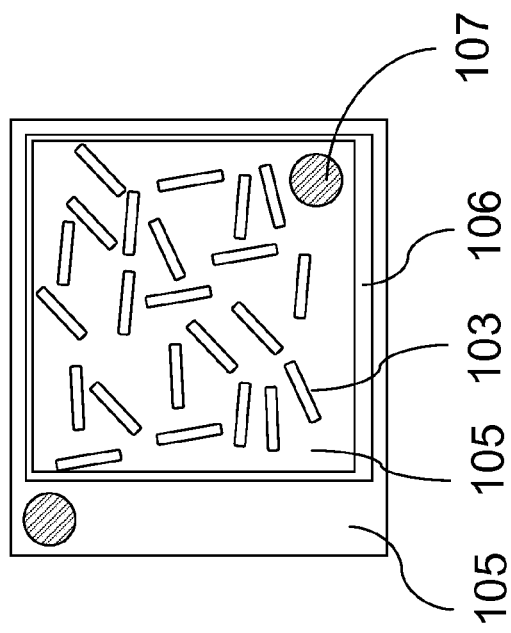
FIG. 2(C) illustrates that, for an optical switch in which nanorods have a certain optical absorption at a given wavelength, when a bias voltage is applied to the device, the optical absorption at that wavelength substantially changes.
Figure 2B:
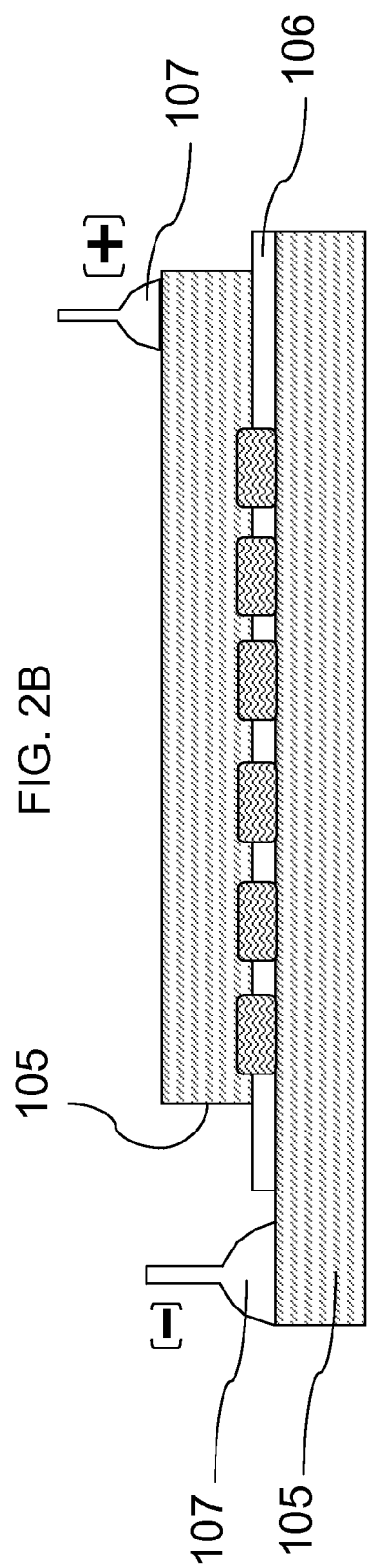
FIG. 2(B) depicts a cross-section of the optical switch. In this sandwiched structure nanorods are the only conductive junctions between the top and bottom surfaces.

In another aspect of the invention, an electrochromic platform is disclosed that electrically modulates the surface plasmon absorption frequency and absorption intensity of a nanorod-coated surface. FIGS. 2A and 2B illustrate an exemplary design of a nanoengineered device in which gold nanoparticles or nanorods (103) are deposited to a conductive or semiconductive surface (105) using methods described herein. Examples of conductive surfaces include, but are not limited to, transparent indium tin oxide (ITO), thin metal film of about 10 nm to about 30 nm thickness such as gold, aluminium, conductive carbon nanotubes, conductive polymers such as poly(acetylene)s, poly(pyrrole)s, poly(thiophene)s, poly(aniline)s, poly(fluorene)s, etc. Examples of semiconductive surfaces include, but are not limited to, silicon, (II-VI and III-V) semiconductors, semiconductive carbon nanotubes, etc. In another aspect of the present invention, the layer (105) comprises a layer of graphene that is decorated with conjugated gold nanorods. A graphene sheet is made of a plane of carbon atoms that are arranged in a generally honeycomb shape in a two-dimensional lattice structure. Graphene conducts in the plane of the carbon atoms.

As depicted in FIG. 2B, to the conductive or semiconductive surface (105) a thin layer of a dielectric material (106) such as silicon oxide is added. The dielectric layer (106) can be added or deposited at any suitable thickness, for instance, at a thickness of about 1 nm to about 200 nm, and is preferably deposited to cover the nanorods and form a flat surface. This is preferably carried out by spin-coating the dielectric layer (106), for instance, using "spin-on-glass" silicon oxide or poly (methyl methacrylate) (PMMA). Next, the electrical insulating or dielectric layer (106) is preferably etched down isotropically to expose the top side of the deposited nanorods (103) from the insulating layer (FIG. 2B).

The rate of insulator etching is critical and is precisely controlled in order to achieve the desired nanorod-nanojunctions. The etching range is preferably between about 1 Å to about 50 Å/sec.

This step is followed by deposition of a thin layer of conductive layer (105) and metallization of the back and front side of the device with conductive elements (107). The conductive elements (107) are electrically in contact via gold nanoparticles or nanorods. Thus, the nanorods (103) form nanorod-nanojunctions that can pass electrical current (as illustrated in FIG. 2B).

In another embodiment, the nanorod-nanojunctions are made without any etching step as follows. Gold nanorods (103) are deposited to the conductive surface (105) followed by a direct deposition of a thin dielectric layer (106) on the gold nanorods. In direct deposition, the sides of the nanorods are not coated with the dielectric layer (106). Once the conductive layer (105) is deposited, it can make a full electrical contact via the sides of the nanorods thus making nanorod-nanojunctions (as illustrated in FIGS. 2F-2H).

In one example, by applying a DC voltage between about 0 to 120 V or an AC voltage ranging from about 0 to 120 volts with a frequency range of about 1 Hz to 1 Giga Hz, a given current goes through nanorod-nanojunctions that dephases the coherent oscillation of surface plasmon electrons. As illustrated in FIG. 2C, if the original light absorption or extinction of the multilayer structure is value "A", upon dephasing the surface plasmon oscillation of electrons, the light absorption of the multilayer structure is reduced to a near zero value. Therefore, the structure shown in FIG. 2A or 2B has a certain absorption wavelength at zero bias voltage, while it has a near zero optical absorption when a bias voltage is applied to the two layers (105). This nanoengineered device can act as an optical switch in which in its OFF state, light is absorbed and in its ON state, light is transmitted.

Referring to FIGS. 2D and 2E, different embodiments of the present invention are shown. FIGS. 2D and 2E each depict nanoengineered devices in which a plurality of nanorods (103) have been formed over a conductive or semiconductive surface (105). Subsequently, a dielectric layer (106) is deposited. FIG. 2D depicts a structure that is obtained in which the dielectric layer (106) covers substantially all sides, including the top portions, of the plurality of nanorods (103). By comparison, FIG. 2E depicts a structure in which the dielectric layer (106) generally covers the sides but not the top portions of the plurality of nanorods (103).

FIGS. 2F-2H depict other embodiments of the present invention in which a structure is obtained such that dielectric layer (106) covers substantially the top portion of nanorod (103), but wherein the sides of nanorod (103) are not covered by dielectric layer (106). After deposition of dielectric layer (106) (FIG. 2F), the dielectric is preferably etched away such that the sides of the nanorod (103) are not covered by dielectric layer (106) (FIG. 2G). In one embodiment, as shown in FIG. 2H, a thin layer of conductive layer (105) is then deposited over the resulting structure.

Figure 3:
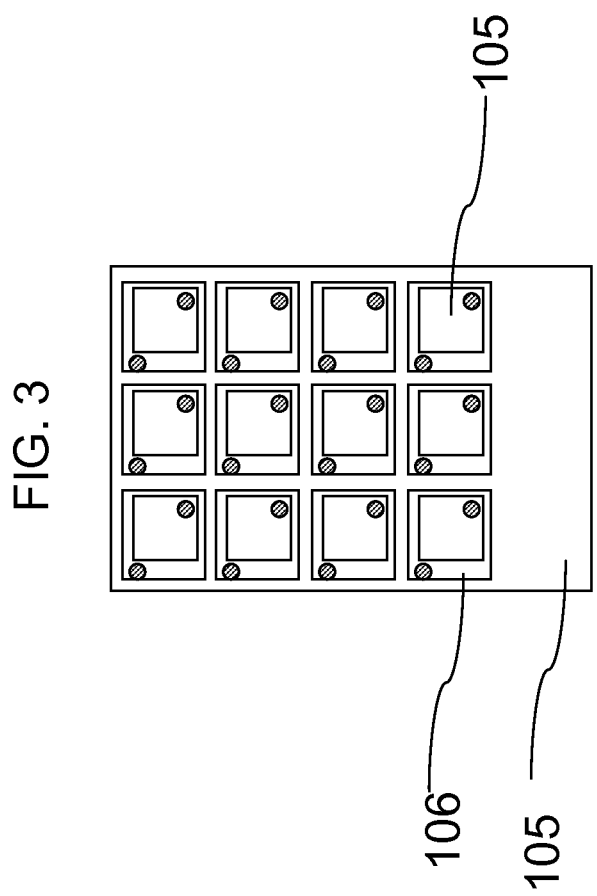
FIG. 3 depicts one embodiment of arrays of nanorod optical switches, wherein each switch can be individually turned ON or OFF acting as pixels of a display device.

In yet another aspect of the invention, depending on the surface plasmon resonance frequency of the deposited metal nanoparticles, e.g., gold nanorods, a device similar to the one shown in FIG. 2A can selectively absorb or transmit different light frequencies from ultraviolet (UV) to infrared (IR). In another aspect of the invention shown in FIG. 3, an optical switch is assembled in an array format to form a group of pixels that can individually be turned ON or OFF, and thus capable of transmitting or absorbing certain wavelengths, respectively. In one embodiment, according to the present invention, arrays of pixels can function as pixels of a display device capable of scattering, absorbing and transmitting light with different wavelengths. In another embodiment, by controlling the transmitted and scattered light from arrays of pixels, an image is constructed. In yet another embodiment, these displays can be fabricated as transparent displays because the thickness of the display is small enough that the display allows partial transmission of the background light through the display device.

Figure 4A:
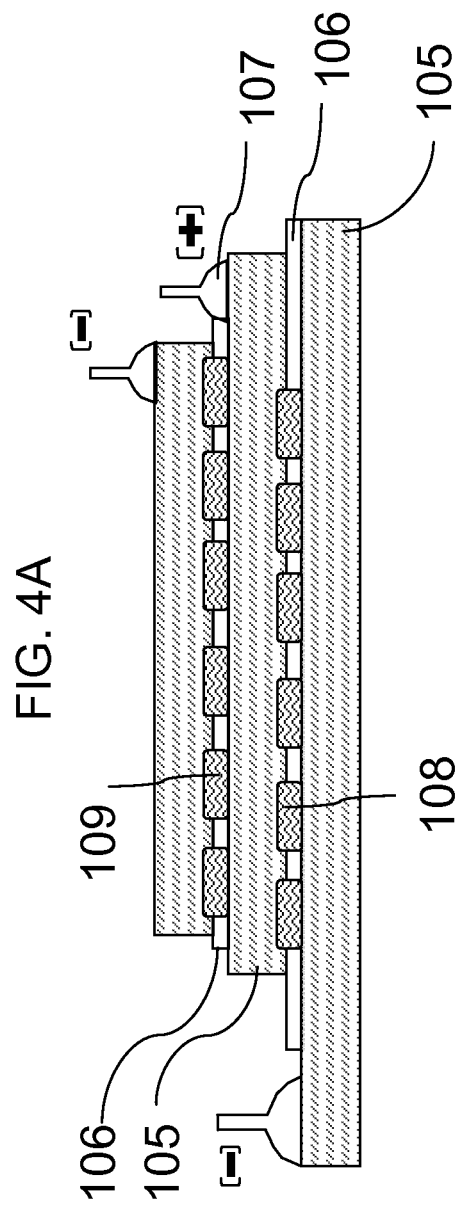
FIG. 4(A) depicts the cross-section of this device.

In another aspect of this invention, a device is fabricated that contains multiple layers of nanorods with different sizes and light absorption wavelengths. In one embodiment, shown in FIG. 4A, the sensing element preferably contains a double layer or multiple layers of gold nanorods, for instance, one layer of gold nanorods (108), and another layer of gold nanorods (109). To make such a double layer or multilayer nanorod device, it is preferred that the nanorod deposition process is repeated to form a second layer (and, if desired, multiple additional layers) of nanorods. The initial layer of nanorods (108) is formed between two conductive or semiconductive layers (105). Each of the layers (105) can be formed with a suitable thickness as needed or desired. In a preferred embodiment, each of the layers (105) is formed with a thickness of about 50 to about 300 nm. Subsequent processing steps can be performed to deposit dielectric layers (106), nanorod layer (109) and metallization of the device with conductive elements (107).

Figure 4B:
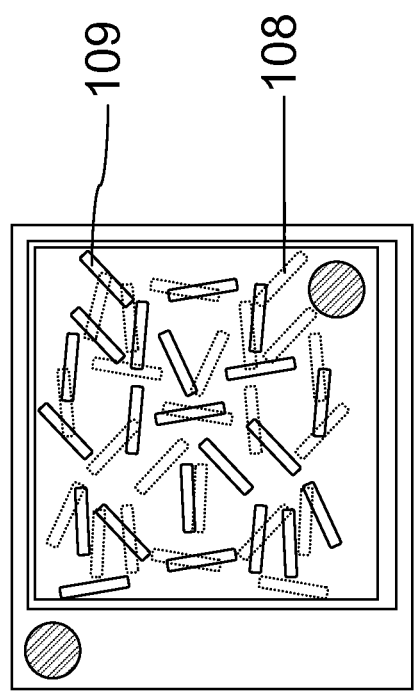
FIG. 4(B) depicts a top view of this device, wherein nanorods with lighter outlines represent those that are deposited in the underlying layers of the device.

In still another embodiment, a two-layer nanorod optical switch, i.e., that includes one layer of gold nanorods (108) and another layer of gold nanorods (109), is depicted in FIG. 4B, in which the underlying layer of nanorods (108) is shown with a dashed line. For making multilayer stacks of nanorods, this process can be repeated as many cycles as desired until a suitable device response is obtained. In another embodiment of the invention, an optical device is made such that it can selectively filter out a specific group of incident wavelengths. Light filtration depends on the absorption wavelengths of different layers of nanorods present in the optical switch.

Figure 5A:
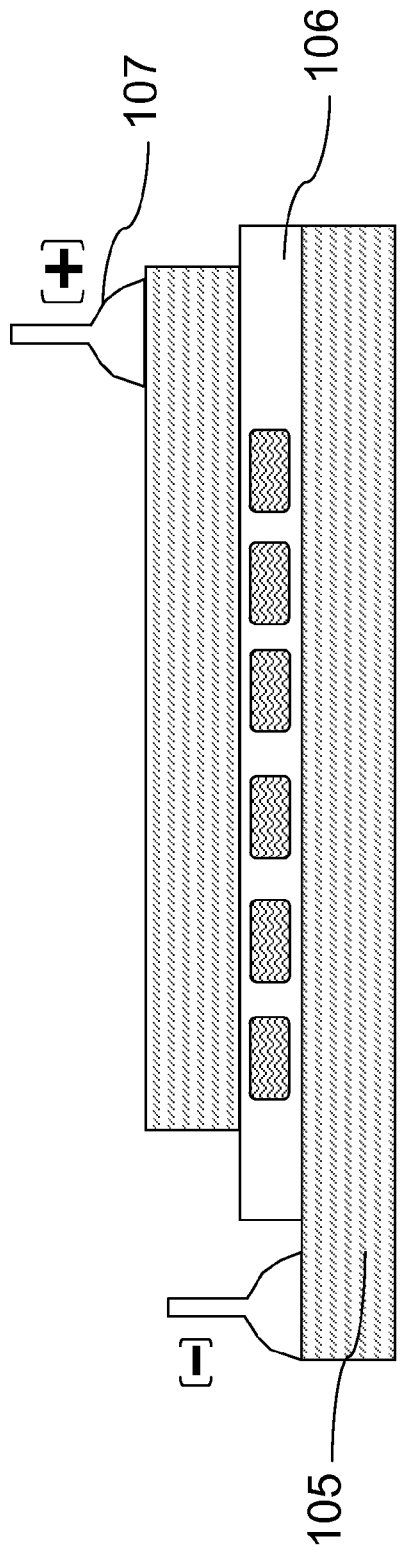
FIG. 5(A) depicts, in one embodiment, sandwiched nanorods that are not electrically in contact between the two electrodes, and wherein the gap is a dielectric material.

In another embodiment, shown in FIG. 5A, plasmonic nanoparticles, e.g. gold nanorods (103), are formed between two conductive or semiconductive layers (105); however, the nanorods (103) are not in direct electrical contact with the layers (105). As shown in FIG. 5A, according to this embodiment, a thin dielectric layer (106) resides between the nanorods (103) and the two layers (105), thereby limiting the charge transport to tunneling. The thickness of this dielectric layer (106) can, for example, be from about 1 nm to about 100 nm. In one aspect of the invention, by applying a DC or AC voltage to this structure the absorption wavelength of the embedded nanorods (103) are shifted or reduced, thereby allowing the application of these nanorods (103) in a wide range of nanoengineered devices, for instance, in filters, optical switches and electro-optical sensors.

Figure 5B:
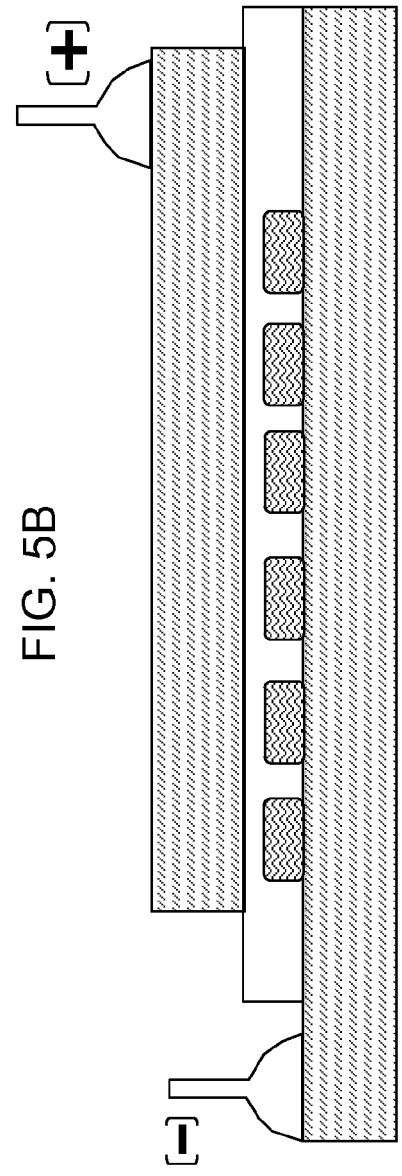
FIG. 5(B) depicts, according to another embodiment, nanorods that are only in electrical contact from one side.

In yet another embodiment, as shown in FIG. 5B, plasmonic nanoparticles, e.g. gold nanorods (103) are formed between two conductive or semiconductive layers (105), such that the nanorods (103) are in electrical contact with one of the conductive layers (105). In another aspect, the embedded nanorods (103) function to collectively act as a plasmonic waveguide through plasmon coupling between the nanorods (103) in the same place. Light travel through the waveguide can be modulated by applying a bias voltage to part of the waveguide.

Figure 6A:
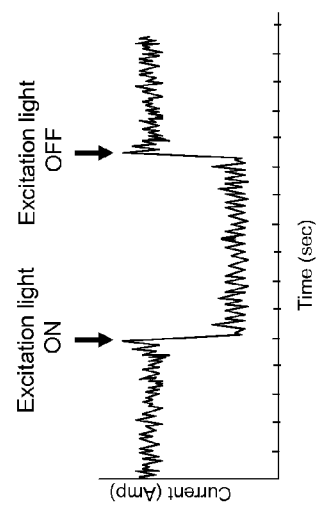
FIG. 6(A) depicts, according to yet another embodiment, a top view of a photodetector device.
Figure 6C:
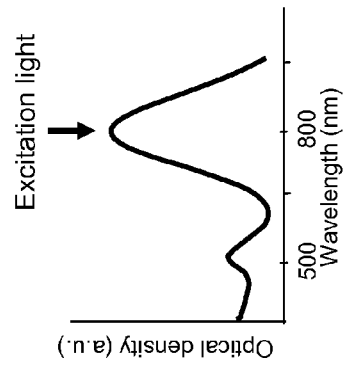
FIG. 6(C) depicts optical absorption spectrum of nanorods sandwiched in the device.
Figure 6D:
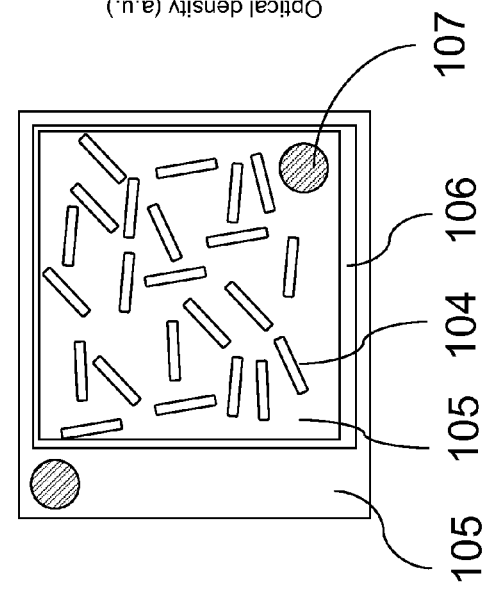
FIG. 6(D) depicts variation in current that goes through nanorod junctions under a given electrical bias.
Figure 6B:
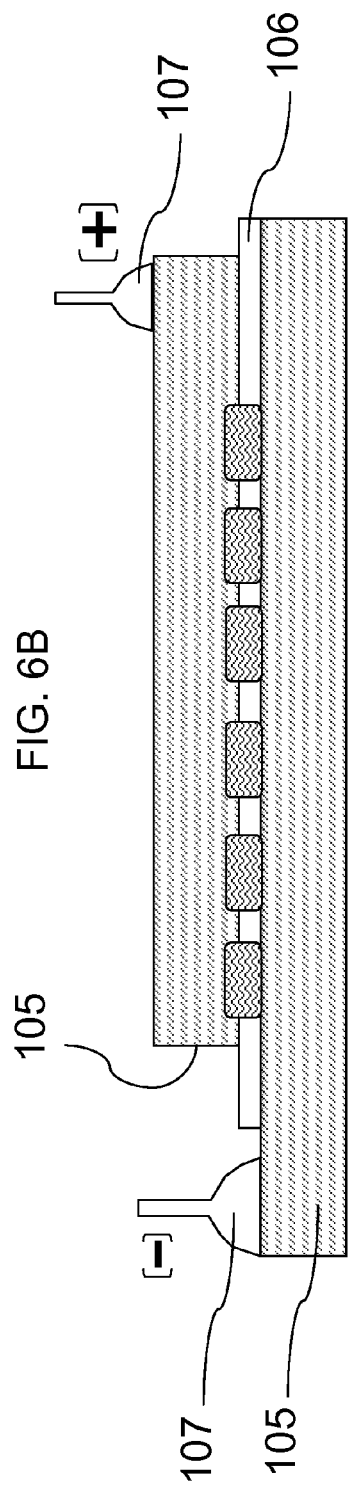
FIG. 6(B) depicts a cross-section of a photodetector device.

In still another aspect of this disclosure, the device shown in FIGS. 6A and 6B is used as a plasmonic photodetector. As shown in FIG. 6C, for a group of sandwiched nanorods (e.g., a plurality of nanorods that are formed between two conductive layers) that have a surface plasmon absorption wavelength at about 800 nm, the thin film device has a given electrical conductance (as shown in FIG. 6D). In one embodiment, while electrical current is transported through a plurality of nanorods (103), the surface plasmon of the nanorods can be excited by an external optical excitation or optical stimulus. The optical excitation of the nanorods results in coherent oscillation of the conduction band electrons, leading to a fluctuation or change in electrical transport at nanorod junctions. This fluctuation in the transported current through the nanorods is used as a response by the nanorods upon an external excitation (shown in FIG. 6D). Since nanorods deposited at each layer have relatively similar dimensions, thus their optical absorption wavelengths remain relatively the same. In one embodiment, by using stacks or multilayers of nanorods (103) with different surface plasmon absorption frequencies, it is possible to fabricate single pixels capable of detecting multiple wavelengths.

It will be understood by those skilled in the art that the optical switches, optical filters, and optical detectors as disclosed herein can be used in a variety of devices in place of prior detectors, sensors and switches, such devices including for instance visible and infrared light array detectors, visible and thermal imaging cameras, thin display devices, transparent displays, sensors, etc.

In summary, plasmonic nanoparticle-based devices are disclosed that enable surprising and unexpected control over tuning the optical properties of nanoengineered surfaces. This disclosure also enables the use of plasmonic nanoparticles as super-sensitive photon detectors functional in a wide range of wavelengths from UV to IR. Metal nanoparticles such as gold nanorods, due to their size-dependent optical activities, are used in such devices as light absorbers, light scatterers and nanojunctions for charge transport. Several examples of such nanoparticle-based devices are disclosed herein, including for instance adjustable light filters, photodetectors and optical switches for display devices.

What has been described herein includes examples and preferred embodiments of the present invention. It should be understood that the exemplary embodiments described herein should be considered in a descriptive sense only and not for purposes of limitation. It is understood by those skilled in the art that changes may be made in these embodiments without departing from the principles and spirit of the invention, the scope of which is defined in the claims and their equivalents.

What is claimed is:

1. A method of forming a nanoengineered device, comprising:
    disposing at least one noble metal nanoparticle over a first conductive layer on a base substrate;
    forming a dielectric or semiconductor layer over the first conductive layer and over at least a top portion of the at least one noble metal nanoparticle; and
    forming a second conductive layer over the dielectric layer, wherein each noble metal nanoparticle acts as an electrical junction between the first and second conductive layers, wherein each electrical junction consists of only one noble metal nanoparticle,
    wherein light absorption, transmission, or response of the device is adjustable by electric charge transport, charge tunneling or optical excitation of each noble metal nanoparticle, wherein electric charge passes through each noble metal nanoparticle.

2. A multilayer nanoengineered device, comprising:
    a base substrate;
    a first conductive layer over the base substrate;
    at least one noble metal nanoparticle over the first conductive layer; a dielectric or semiconductor layer over the first conductive layer and over at least a top portion of the at least one noble metal nanoparticle;
    and a second conductive layer over the at least one noble metal nanoparticle, wherein each noble metal nanoparticle acts as an electrical junction between the first and second conductive layers, wherein each electrical junction consists of only one noble metal nanoparticle, wherein electrical transport at each electrical junction is adjustable by electric charge transport, charge tunneling or optical excitation of each noble metal nanoparticle.

3. The multilayer nanoengineered device of claim 2, further comprising a dielectric layer or semiconductor deposited over at least one of the first conductive layer, the second conductive layer, and a top portion of each noble metal nanoparticle.

4. The multilayer nanoengineered device of claim 2, wherein the at least one metal nanoparticle includes at least one gold nanorod.

5. The multilayer nanoengineered device of claim 2, wherein each of the first conductive layer and the second conductive layer has a thickness of between about 10 nm and about 500 nm.

6. The nanoengineered device of claim 2, wherein at least one of the noble metal nanoparticles has an aspect ratio greater than about one.

7. The nanoengineered device of claim 2, wherein the first conductive layer and the second conductive layer are treated with one or more linking molecules selected from the group consisting of dithiols, diamines, amino-silane molecules.

8. The nanoengineered device of claim 7, wherein the linking molecules comprise 3-aminopropyltriethoxy-silane.

9. The nanoengineered device of claim 2, wherein the device is selected from the group consisting of an electrochromic display, an optical switch, an optical filter, a switchable waveguide, a photon detector, and a device that includes at least one nanoparticle-based pixel.

* * * * *